US012710457B2

(12) United States Patent
Batz et al.

(10) Patent No.: US 12,710,457 B2
(45) Date of Patent: Aug. 18, 2026

(54) STATE ESTIMATION OF A POWER NETWORK

(71) Applicant: Siemens Aktiengesellschaft, Munich (DE)

(72) Inventors: Sascha Batz, Hemhofen (DE); Mathias Duckheim, Erlangen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 418 days.

(21) Appl. No.: 18/250,576

(22) PCT Filed: Oct. 19, 2021

(86) PCT No.: PCT/EP2021/078864
§ 371 (c)(1),
(2) Date: Apr. 26, 2023

(87) PCT Pub. No.: WO2022/089983
PCT Pub. Date: May 5, 2022

(65) Prior Publication Data
US 2023/0400483 A1 Dec. 14, 2023

(30) Foreign Application Priority Data
Oct. 29, 2020 (EP) .................................... 20204648

(51) Int. Cl.
*G01R 19/25* (2006.01)
*G06N 3/08* (2023.01)

(52) U.S. Cl.
CPC .......... *G01R 19/2513* (2013.01); *G06N 3/08* (2013.01)

(58) Field of Classification Search
CPC .... H02J 13/00002; H02J 3/00; H02J 2203/10; G01R 19/2513; G06Q 50/06; G06N 3/08; Y02E 60/00; Y04S 10/30
(Continued)

(56) References Cited

U.S. PATENT DOCUMENTS

| | | | | |
|---|---|---|---|---|
| 2020/0166552 | A1 | 5/2020 | Saneyoshi et al. | |
| 2020/0293032 | A1 * | 9/2020 | Wang | G01R 31/086 |
| 2021/0036521 | A1 | 2/2021 | Chapotard et al. | |

FOREIGN PATENT DOCUMENTS

| | | | |
|---|---|---|---|
| CN | 107994570 A | 5/2018 | G06N 3/04 |
| EP | 3 336 995 | 6/2018 | H02J 3/00 |
| EP | 3518369 A1 | 7/2019 | H02J 13/00 |

OTHER PUBLICATIONS

Mathias et el. , EP 3336995, "Method, Control Device and System for Determining State Values for Describing Operating States in a Subnetwork of an Energy Supply Network", Date published: Jun. 20, 2018, English translation (Year: 2018).*

(Continued)

*Primary Examiner* — John H Le
(74) *Attorney, Agent, or Firm* — Slayden Grubert Beard PLLC

(57) ABSTRACT

Various embodiments include a computer-aided method for state estimation of a power network using an artificial neural network with one or more inputs technically associated with the power network. The method may include calculating a state estimation using captured temporal measurement signals of the power network as inputs for the neural network. At least an amplitude of a harmonic of one of the measurement signals is used as an input for the neural network.

12 Claims, 2 Drawing Sheets

(58) Field of Classification Search
USPC .......................................................... 702/61
See application file for complete search history.

(56) References Cited

OTHER PUBLICATIONS

Blooming et al., "Application of IEEE STD 519-1992 Harmonic Limits", year 2006 EEE (Year: 2006).*
Search Report for International Application No. PCT/EP2021/078864, 21 pages, Feb. 10, 2022.
Lai, L.L. et al, "A Two-ANN Approach to Frequency and Harmonic Evaluation," Fifth International Conference on Artificial Neural Networks, (Conf. P Ubl. No. 440), pp. 245-250, Jul. 7, 1997.
Zhijian, Hu et al., "Harmonic Real Time Estimation by Artificial Neural Network Based on Network and GPS Technology," 2005 Power Engineering Conference, IPEC 2005, 6 pages, Nov. 29, 2005.
Extended European Search Report, Application No. 20204648.8, 9 pages, Mar. 25, 2021.
International Preliminary Report on Patentability, Application No. PCT/EP2021/078864, 14 pages, Feb. 6, 2023.
Chinese Office Action, Application No. 202180073685.0, 31 pages.

* cited by examiner 1
11
12
14
21
22
24
41
42
44
46

4
101
100
104
42
101
100

STATE ESTIMATION OF A POWER NETWORK

CROSS-REFERENCE TO RELATED APPLICATIONS

This application is a U.S. National Stage Application of International Application No. PCT/EP2021/078864 filed Oct. 19, 2021, which designates the United States of America, and claims priority to EP Application No. 20204648.8 filed Oct. 29, 2020, the contents of which are hereby incorporated by reference in their entirety.

TECHNICAL FIELD

The present disclosure relates to power networks. Various embodiments include methods and/or systems for regulating power networks.

BACKGROUND

In order to regulate/control energy transmission networks, in particular power networks, it is important to capture the state of the respective network (network state) almost in real time. Determination of the network state is typically not fully possible, and so an estimation of the network state (state estimation) is used for this purpose.

The network state, that is to say for example the voltage and/or the current, the active and/or reactive power infeed/outfeed at the nodes or within branches of the power network, is typically unknown for low-voltage networks (local networks). In particular with respect to locally generated renewable energy and therefore with respect to a decentralized generation of energy, for example by way of photovoltaic installations that feed into the local low-voltage network and by way of additional loads that were not taken into consideration in the planning of the power network, such as charging operations of electric vehicles and heat pumps, for example, capturing the network state, that is to say the state estimation for power networks, is becoming increasingly important. This is therefore in particular the case since the network operator has to ensure the compliance with respective limit values for the network state variables of the network, for example voltages, currents and/or powers.

The knowledge of the network state is of importance in particular with respect to more recent developments, such as local energy markets that are essentially characterized by a decentralized and local regulation of consumption and generation. Such a local energy market for exchanging electrical energy is disclosed for example in document EP 3518369 A1.

The network state variables are typically captured, if they are at all, in low-voltage networks at individual central measuring locations, such as transformer stations, for example. In this case, the network topology and the network state of the underlying network are however largely unknown. In principle, the network state could be ascertained by measuring the corresponding network state variables (measured variables), such as voltage, current, active power and/or reactive power, at all the available nodes of the power grid. This would, however, entail a high level of outlay and large investments for measuring devices, start-up and configuration and operation that are too great for the typical cost structures for medium-voltage networks and/or low-voltage networks.

Methods that can estimate the network state on the basis of few measurement signals (state estimation) are more advantageous. The term state estimation therefore denotes the estimation of the present network state on the basis of measurements, that is to say measurement signals. In principle, an attempt is made to deduce, on the basis of a captured summed signal of a measurement location, the consumption and/or the generation of the installations downstream of the measurement location (disaggregation). If, for example, $P_i(t)$ denotes the power infeeds of different installations i=1, . . . , N, a summed signal $$P(t) = \sum_{i=1}^{N} P_i(t)$$

is thus measured, for instance at a transformer station. A disaggregation is therefore an assignment $P(t) \rightarrow (P_1(t), P_2(t), \ldots, P_N(t))$. Such a disaggregation is however extremely complex and highly underdetermined, meaning that typically only an estimation regarding the network state can be carried out (state estimation).

Artificial neural networks (ANN for short), that is to say AI, can be used for the state estimation of power networks.

SUMMARY

The present disclosure describes improved methods and/or systems for the state estimation of a power network by means of an artificial neural network providing improved training for the state estimation. For example, some embodiments include a computer-aided method for the state estimation (2) of a power network, in particular a low-voltage network and/or medium-voltage network, by means of an artificial neural network (1), wherein the neural network (1) has one or more inputs (41) technically associated with the power network, and the state estimation (2) is calculated using captured temporal measurement signals (4) of the power network that are used as inputs (41) for the neural network (1), characterized in that at least the amplitude (42) of a harmonic of one of the measurement signals (4) is used as an input (41) for the neural network (1).

In some embodiments, the amplitude (42) of the harmonic is ascertained by means of a Fourier transformation (104) of the measurement signal (4).

In some embodiments, one or more ratios of amplitudes (42) of harmonics of the measurement signal (4) are additionally used as inputs (41).

In some embodiments, one or more rise times (42) and/or one or more fall times (42) within the measurement signal (4) are additionally used as inputs (41).

In some embodiments, the rise times (42) and/or fall times (42) are ascertained by means of a Padé-Laplace method, wherein the rise times (42) and/or fall times (42) are ascertained using the poles of the Padéapproximation of the Laplace transforms of the measurement signal (4).

In some embodiments, the order [n/(n−1)] is used for the Padéapproximation.

In some embodiments, n is increased up to a stipulated maximum value until no further rise times (42) and/or fall times (42) are ascertained.

In some embodiments, amplitudes (42) of subharmonics of the measurement signal (4) are additionally used as inputs (41).

In some embodiments, the measurement signals (4) comprise one or more voltage signals, one or more current signals, one or more active power signals and/or one or more reactive power signals of the power network, which are additionally used as inputs (41).

In some embodiments, the measurement signals (4) are captured at nodes of the power network, in particular at substations and/or transformer stations.

In some embodiments, the neural network (1) used is a neural network that has been trained by means of a training dataset that comprises a plurality of amplitudes (42) of harmonics of one and/or more measurement signals (4), wherein the amplitudes (42) of the harmonics have been used as inputs (41) in order to train the neural network (1).

In some embodiments, the neural network (1) used is a neural network that has been trained by means of a training dataset that comprises a plurality of rise times (42) and/or fall times (42) of one and/or more measurement signals (4), wherein the rise times (42) and/or fall times (42) have been used as inputs in order to train the neural network (1).

In some embodiments, the state estimation (2) is carried out for a power network in the form of a low-voltage network and/or medium-voltage network.

As another example, some embodiments include a method for training an artificial neural network (1) for the state estimation (2) of a power network, in particular a low-voltage network and/or medium-voltage network, wherein the neural network (1) has one or more inputs (41) technically associated with the power network, and the state estimation (2) is calculated using captured temporal measurement signals (4) of the power network that are used as inputs (41) of the neural network (1), characterized in that the training is carried out by means of a training dataset that comprises a plurality of amplitudes (42) of harmonics, a plurality of rise times (2) and/or a plurality of fall times (42) of one and/or more measurement signals (4), wherein the amplitudes (42) of the harmonics, the rise times (42) and/or the fall times (42) are used as inputs (41) in order to train the neural network (1).

As another example, some embodiments include an artificial neural network (1) for the state estimation (2) of a power network, in particular a low-voltage network and/or medium-voltage network, wherein the neural network (1) has one or more inputs (41) technically associated with the power network, and the state estimation (2) is calculated by means of the neural network (1) using captured temporal measurement signals (4) of the power network that are used as inputs (41) of the neural network (1), characterized in that the neural network (1) is designed in such a way that the amplitude (42) of a harmonic of one of the measurement signals (4) is able to be used as an input (41) for the neural network (1).

BRIEF DESCRIPTION OF THE DRAWINGS

Further advantages, features and details of the teachings herein emerge from the exemplary embodiments described below and with reference to the drawings, in which, schematically.

DETAILED DESCRIPTION

Figure 1:
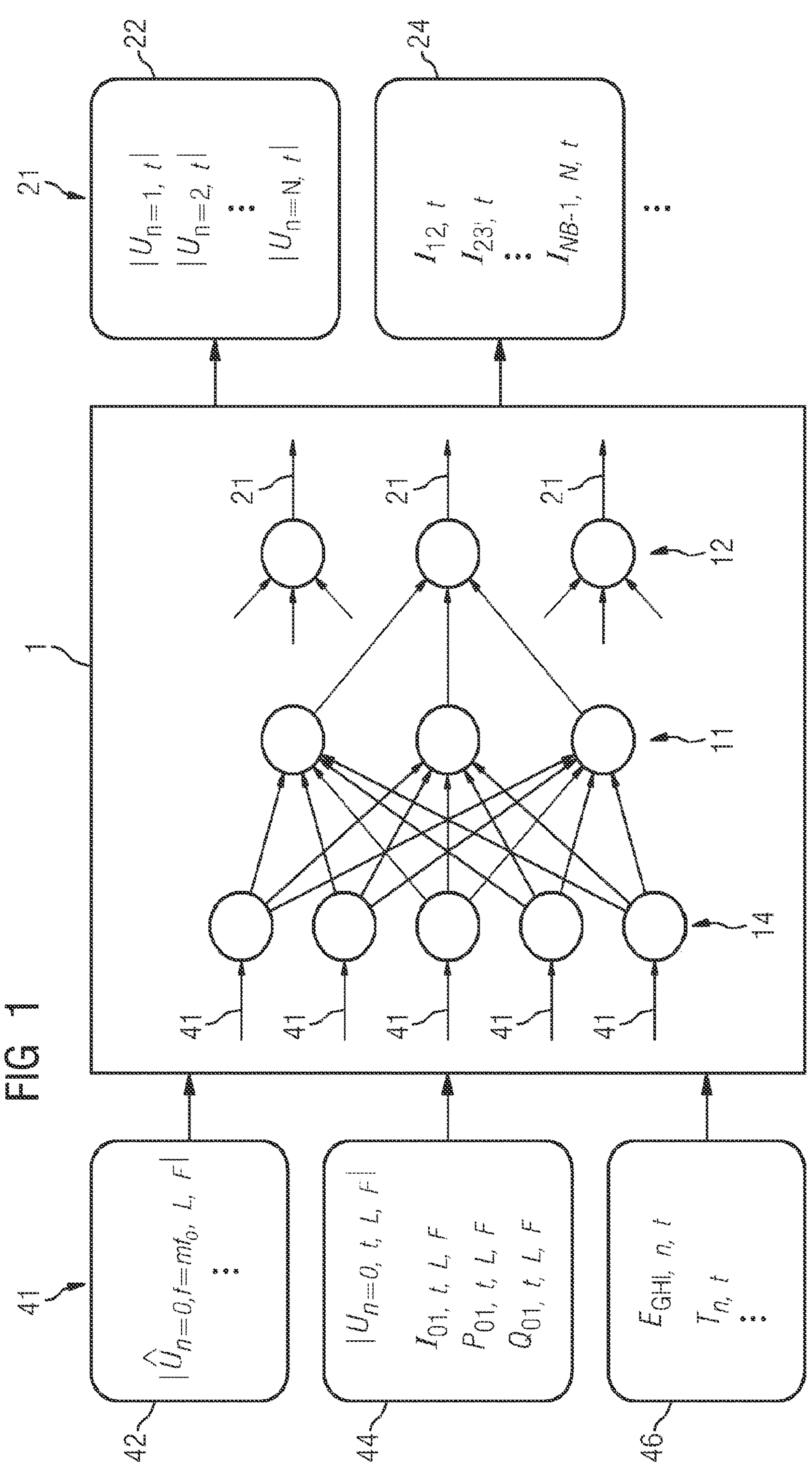
FIG. 1 shows a flowchart of a state estimation incorporating teachings of the present disclosure.

The teachings of the present disclosure include various computer-aided methods for the state estimation of a power network, in particular a low-voltage network and/or medium-voltage network, by means of an artificial neural network, wherein the neural network has one or more inputs technically associated with the power network, and the state estimation is calculated using captured temporal measurement signals of the power network that are used as inputs for the neural network, is characterized in that at least the amplitude of a harmonic of one of the measurement signals is used as an input for the neural network. The methods described herein and/or one or more functions, features and/or steps of the methods and/or of one of its configurations can be computer-aided.

In principle, state variables of a power network, in particular the complex voltage values and current values thereof, at a plurality of nodes and/or branches of the power network, are calculated and estimated by means of state estimation (network state estimation) of the power network. This is carried out on the basis of measured values or measurement signals of the mentioned state variables that have only been captured or are only captured in individual regions or at individual points of the power network.

In the present disclosure, an artificial neural network is referred to as a neural network, which means the term neural network is always understood to mean artificial neural networks (ANNs). The neural network has at least one input layer, one or more hidden layers and an output layer. The input layer of the neural network, and therefore the neural network, comprises a plurality of inputs technically associated with the power network. In other words, values of technical variables of the power network, for example the voltages thereof at a plurality of nodes, can be supplied to one of the inputs of the neural network as an input value. In other words, input values are present at the inputs of the neural network. In the present case, the inputs or the input values are ascertained at least partially on the basis of temporal measurement signals of the power network. The neural network calculates one or more output values on the basis of the inputs mentioned or the associated input values. In other words, the neural network has one or more outputs. The output values therefore correspond to a particular state estimation.

The inputs can therefore likewise be considered to be input neurons and the outputs to be output neurons of the neural network. If a variable, such as the amplitude of a harmonic, for example, is used as an input of the neural network, this therefore means, in other words, that the value of the variable is supplied to at least one input neuron of the neural network as an input value.

The amplitude of the harmonic is fundamentally in complex-value form, that is to say that it has a magnitude and a phase or a real part and an imaginary part. In the present case, the term amplitude therefore comprises the magnitude of the amplitude, the phase, the real part and the imaginary part of the harmonic. In other words, the complex-value amplitude, the magnitude of the amplitude, the real part and/or the imaginary part of the amplitude of the harmonic can be used individually or in combination as an input or inputs.

At least the amplitude of one of the harmonics of one of the measurement signals is used as an input for the neural network. In other words, the neural network has an input or an input neuron to which the amplitude or the amplitude value of the harmonics of the measurement signal can be supplied as an input or input value. The neural network is designed and trained in such a way that it takes into consideration and uses the amplitude of the harmonics to calculate the state estimation of the power network. In other words, optionally in addition to the measurement signals captured directly, spectral data of the measurement signals (frequency domain) are used according to the invention for the state estimation.

By way of example, if the power network in the form of an AC voltage network has the fundamental frequency $f_0$, for example 50 Hz or 60 Hz, a harmonic of the measurement signal is therefore characterized in that said harmonic has a frequency that is an integer multiple of the mentioned fundamental frequency of the power network. By way of example, if U(t) denotes the temporal measurement signal of the voltage at a node of the power network for a particular time range, $\hat{A}_m=|\hat{U}/(f=mf_0)|$ is the amplitude of the mth harmonic of the time signal, wherein $\hat{U}(f)$ denotes the Fourier transform (spectral function) of the measurement signal. In principle, the complex amplitude $\hat{A}_m=\hat{U}(f=mf_0)$ and/or the real part $\hat{A}_m=\text{Re}[\hat{U}(f=mf_0)]$ thereof and/or the imaginary part $\hat{A}_m=\text{Im}[\hat{U}(f=mf_0)]$ and/or the magnitude thereof $\hat{A}_m=|\hat{U}(f=mf_0)|$ and/or the phase thereof can be used as the amplitude within the context of the present invention.

In other words, the methods described herein not only use the individual temporal measurement signals U(t) to train the neural network and/or for the state estimation, for example, but rather to additionally use values of the frequency-dependent associated spectral function of the measurement signal $\hat{U}(f)$.

The amplitudes of the harmonics of the measurement signal are particularly well suited to the state estimation, since these are characteristic of non-linear components and/or installations of the power network. The harmonics therefore figuratively form a type of fingerprint for the components and/or installations connected to the power network. The state estimation for the power network is therefore improved by the appropriately designed and trained neural network incorporating teachings of the present disclosure.

Improved estimation of the network state (state estimation) can be achieved without further or greater installations or investments in the power network. This is therefore the case since the accumulated captured measurement signal at the respective node of the power network, in particular merely at the zeroth node of the power network, for example at a transformer station, is essentially sufficient.

Furthermore, some of the methods incorporating teachings of the present disclosure save resources, since a Fourier transformation is able to be efficiently implemented, for example by means of fast Fourier transformation (FFT for short), or is even able to be executed directly by the measuring apparatus that captures the measurement signal and provides it for the neural network.

The teachings of the present disclosure therefore provide improved network state estimation, in particular for highly underdetermined systems, such as medium-voltage or low-voltage networks, for example. Improved intelligent regulation of the power network, in particular with respect to digital power networks, is thereby able to be achieved.

In some embodiments, the amplitude of the harmonic is ascertained by means of a Fourier transformation of the measurement signal. The spectrum of the measurement signal may be ascertained by means of the Fourier transformation. The spectrum or the spectral function ascertained from the measurement signal typically has, for a power network, a plurality of peak values (peaks) that correspond to the harmonics or the amplitudes thereof. The harmonics and the associated amplitudes thereof can therefore advantageously be ascertained quickly and efficiently by means of the Fourier transformation. Furthermore, additional temporal and/or spectral filters can be provided. By way of example, only a particular time range is used for the Fourier transformation and/or a particular frequency range is taken into consideration in order to ascertain the amplitudes of the harmonics. In principle, any known method can be used to ascertain or determine the amplitudes, in particular an FFT.

In some embodiments, one or more ratios of amplitudes of harmonics of the measurement signal are additionally used as inputs. In other words, the neural network is designed and trained in such a way that the ratio of the amplitudes can be supplied thereto as an input value for an input neuron. This may improve the state estimation for the power network. This is therefore the case since components and/or installations of the power network have a particular ratio of amplitudes of harmonics. In other words, the ratio of amplitudes of particular harmonics is an improved fingerprint for the respective components and/or installations of the power network. Therefore, by way of example, for power supply units it holds that $|\hat{U}_5/\hat{U}_0|\in[0.5,0.7]$, wherein $\hat{U}_5$ denotes the amplitude of the $5^{th}$ harmonic and $\hat{U}_0$ denotes the amplitude of the fundamental frequency.

In some embodiments, one or more rise times and/or one or more fall times within the measurement signal are additionally used as inputs. In other words, rise times and/or fall times ascertained from the measurement signal are used as input values for the neural network. In this case, the neural network is in turn appropriately designed and trained such that it can take the rise times and/or fall times into consideration as inputs. In other words, the neural network has inputs or input neurons for the rise times and/or fall times ascertained from the measurement signal or measurement signals.

The rise times and/or fall times are ascertained from the measurement signal. If a plurality of measurement signals are available, rise times and/or fall times can be ascertained for each measurement signal and taken into consideration by the neural network. The rise times and/or fall times are characteristic of the components/installations connected to the power network. By way of example, a heat pump has a characteristic rise time. The rise times and/or fall times therefore form an additional fingerprint for the components and/or installations of the power network. The neural network takes said fingerprint into consideration or can be trained using this in an improved manner, with the result that improved state estimation can be ascertained thereby.

In some embodiments, the rise times and/or fall times are ascertained by means of a Fade-Laplace method, wherein the rise times and/or fall times are ascertained using the poles of the Fade approximation of the Laplace transforms of the measurement signal. As already mentioned above, the rise times and/or fall times form a fingerprint for components and/or installations of the power network. It is not readily possible to ascertain the rise times and/or fall times from the measurement signal or the Fourier transform thereof, however.

In the present case, the rise times and/or fall times may be ascertained by means of the Fade-Laplace method (Fade-Laplace fitting). To this end, the Laplace transform of the measurement signal is ascertained, for example numerically. The Laplace transform of one or more exponential rises/falls has real-value poles that correspond to the characteristic rise times and/or fall times. The residual of the poles corresponds to the amplitude of the rise/fall. The rise times and/or fall times can therefore in principle be ascertained from the Laplace transform. By way of example, a characteristic fall within the measurement signal of the form $f(t)\sim a\cdot\exp(-kt)$ has the Laplace transform $L(s)\sim a/(k+s)$. This thus has a pole for $s^*=-k$. In this simple example, the characteristic fall time T is ascertained using $T=1/k=1/|s^*|$.

However, a plurality of rises/falls can be simultaneously present within the measurement signal, with the result that the Laplace transform has a plurality of associated poles. The Laplace transform may be approximated by way of a Padéapproximation in order to ascertain a plurality of poles and therefore a plurality of fall times and/or rise times. In this case, a rational function (Padéapproximant) of the order [n/m] is ascertained, which approximates the Laplace transform. This is therefore advantageous since the poles of the Laplace transforms can be particularly efficiently ascertained by way of the zeros of the denominator of the ascertained rational function. The technically characteristic rise times and/or fall times of components and/or installations of the power network can be particularly advantageously ascertained as a result, even if the rises/falls thereof are superimposed in the measurement signal.

The order [n/(n−1)] may be used for the Padéapproximation ($n\geq 2$). In other words, the numerator of the Padéapproximant may be an nth degree polynomial, and the denominator of the Padéapproximant is particularly preferably an (n−1)th degree polynomial. This therefore may ensure that the poles of the Bade approximant $$R_{n-1}^{n}(s)$$

correspond to the characteristic rise times and/or fall times within the measurement signal.

By way of example, if $$L(s)=\int_{0}^{\infty} f(t)e^{-st}dt$$

is the Laplace transform of the temporal measurement signal f(t), the best possible rational function in the context of the Bade-Laplace method is ascertained using $$L(s)\approx R_{n-1}^{n}(s)=\sum\nolimits_{j=0}^{n} a_j s^j \Big/ \left(1+\sum\nolimits_{j=1}^{n-1} b_j s^j\right),$$

wherein the coefficients $a_j$ and $b_j$ are determined for this purpose. The rise times and/or fall times are therefore determined using $$1+\sum\nolimits_{j=1}^{n-1} b_j s^j = 0,$$

wherein mathematically equivalent formulations of the denominator $$R_{n-1}^{n}(s)$$

are equivalent thereto. The ascertained zeros of the denominator of the Bade approximant or the ascertained poles $s^*$ ultimately correspond, for example by way of $T=1/|s^*|$, to the characteristic rise times and/or fall times. In a manner equivalent to rise times and/or fall times determined in this way, the associated values of the poles ($s^*$) can be used directly as inputs for the neural network for the state estimation and/or for the training of the neural network.

In some embodiments, n is increased up to a stipulated maximum value until no further rise times and/or fall times are ascertained. All the characteristic fall times and/or rise times present in the measurement signal can be ascertained as a result. This is therefore the case since in principle a further zero of the denominator (pole) of the Bade approximant can be added each time n is increased. If n is increased and no further poles are added, it can be assumed that all the present characteristic rise times and/or fall times have been ascertained.

As an example, a method for ascertaining the rise times and/or fall times for state estimation of a power network therefore comprises the following steps:

- calculating the Laplace transform of the measurement signal;
- ascertaining the Padéapproximant of the order [n/(n−1)] for the calculated Laplace transform;
- ascertaining the poles of the Padéapproximant, wherein the rise times and/or fall times are determined by way of the poles; and
- increasing n ($n\rightarrow n+1$) until there are no further poles.

The rise times and/or fall times thus ascertained from the measurement signal or the measurement signals are then supplied to the inputs of the neural network for the state estimation and/or used to train the neural network.

In some embodiments, amplitudes of subharmonics of the measurement signal are additionally used as inputs. In other words, the neural network is designed and trained in such a way that it takes into consideration or uses subharmonics of the measurement signal as inputs for the state estimation. By way of example, subharmonics arise if the measurement signal comprises characteristic non-periodic components.

In some embodiments, the measurement signals are captured at nodes of the power network, in particular at substations and/or transformer stations. This may improve the state estimation for the power network. Furthermore, the nodes are typically formed by installations that are accessible and characteristic of the power network, such as substations, transformer stations and/or power boxes. There it is possible to capture the measurement signals, for example to measure the voltage, the current, the active power and/or reactive power, in a simple manner. In addition, additional measuring devices, if necessary and advantageous, can be installed or retrofitted there in a simple manner. Furthermore, the network topology of the power network is taken into consideration in the capture of the measurement signals at the nodes of the power network.

In some embodiments, the neural network used is a neural network that has been trained by means of a training dataset that comprises a plurality of amplitudes of harmonics of one and/or more measurement signals, wherein the amplitudes of the harmonics have been used or are used as inputs in order to train the neural network.

In some embodiments, the neural network used is a neural network that has been trained by means of a training dataset that comprises a plurality of rise times and/or fall times of one and/or more measurement signals, wherein the rise times and/or fall times have been used or are used as inputs in order to train the neural network. In other words, the neural network trained in this way is designed, for one or more unknown measurement signals that have not been used for the training and for example have been presently captured at one or more nodes of the power network, to take into consideration the amplitudes of harmonics of the measurement signal and/or rise times and/or fall times ascertained from the measurement signal as inputs and therefore to use them for the state estimation for the power network.

In some embodiments, the state estimation is carried out for a power network in the form of a low-voltage network and/or medium-voltage network. In other words, the power network is preferably in the form of a low-voltage network and/or medium-voltage network. In particular for low-voltage networks and/or medium-voltage networks, there is not sufficient measured-value-based knowledge regarding the network state. The teachings of the present disclosure solves this technical problem by means of a correspondingly configured neural network that takes into consideration, or directly involves, spectral data and additionally characteristic rise times and/or fall times for the state estimation in a manner incorporating teachings of the present disclosure.

Identical, equivalent or functionally identical elements may be provided with the same reference signs in one of the figures or throughout the figures. FIG. 1 shows a schematic flowchart of a state estimation 21 for a power network using a neural network 1 that is trained and configured incorporating teachings of the present disclosure.

FIG. 1 symbolically illustrates the neural network 1 by way of its neurons (circles) and its connections (arrows). The neural network 1 has an input layer 14 with a plurality of inputs 41, one or more hidden layers 11 and an output layer 12 with a plurality of outputs 21.

If corresponding data are supplied to the input layer 14 or to each of the inputs 41, or are present at the input layer 14, the neural network 1 thus calculates, by way of its hidden layers 11, the outputs 21 that correspond to the outputs 21 of the neural network. For the supplied inputs 41, the outputs 21 then correspond to the state estimation for the power network, and so the state estimation is designated by the same reference sign 21.

In order to calculate the state estimation 21, input values or input data are therefore required, which have to be supplied to the inputs 41 of the neural network 1. In other words, the inputs 41 can be identified with these data/values since a specified input 41 is assigned to each particular value, for example a voltage value. In the present case, a plurality of different data/values/inputs that are categorized in boxes 42, 44, 46 in the figure are used.

According to the present configuration, the amplitudes of harmonics 42 of the measurement signals, rise times 42 within the measurement signals and/or fall times 42 within the measurement signals are used as inputs 41. These inputs according to the invention, that is to say the amplitudes of harmonics, the rise times and/or the fall times are combined in the box 42 in FIG. 1, and so these have the same reference sign 42 in the present case. Furthermore, ratios of amplitudes of harmonics within the same measurement signal and/or over different measurement signals can be used as inputs 41.

The measurement signals are captured at the power network, in particular at nodes of the power network, for the state estimation 21. By way of example, the signals are captured within a time range, wherein in that case the state estimation 21 is calculated for the time range mentioned. In other words, a time-resolved state estimation can be carried out on the basis of presently captured measurement signals. The measurement signals can be voltage signals, current signals, active power signals and/or reactive power signals. In other words, the measurement signals can capture the voltage, the current, the active power and/or the reactive power (measured variables) at respective nodes and/or branches of the power network within a stipulated or particular time range. In other words, a time characteristic of the respective measured variable is captured at one or more nodes of the power network. If the time ranges mentioned are sufficiently short and if such a measured-value-based or measurement-signal-based state estimation 21 is carried out by means of the neural network 1 for each time range, a state estimation 21 is achieved in real time.

The amplitudes of the harmonics are typically ascertained by means of a Fourier transformation of the respective measurement signal. In other words, the Fourier transform of the measurement signals is calculated, for example by means of an FFT. In a manner equivalent to this, the spectral power density of the measurement signal, that is to say the spectrum of the measurement signal, could be ascertained. This can be carried out by means of autocorrelation of the measurement signal. The frequency spectrum of the measurement signal is calculated by means of the Fourier transforms of the measurement signal. The magnitude of the frequency spectrum is referred to as the amplitude spectrum and can, like the spectral power density, also be used to ascertain the amplitudes of the harmonics. What is crucial is that spectral, that is to say frequency-dependent, data are ascertained from the measurement signal, by means of which it is possible to ascertain the harmonics and their associated amplitudes. To this end, one particularly preferred means is the Fourier transformation and/or the calculation of the spectral power density.

The amplitudes, ascertained from the measurement signals, of the harmonics are denoted by $\hat{U}_{n,f=mf_0,L,F}$ in FIG. 1, wherein n designates the node of the power network, $f_0$ the fundamental frequency, $mf_0$ the frequency of the mth integer harmonic, L the phase/line conductor and F the respective feeder. According to the exemplary embodiment shown in FIG. 1, the magnitudes of the amplitudes $\hat{U}_{n,f=mf_0,L,F}$ are supplied to the neural network 1 as inputs 41 for the state estimation 21, wherein the $\hat{U}_{n,f=mf_0,L,F}$ are ascertained from the captured measurement signals. The state estimation 21 is therefore carried out on the basis of present measurement data or the associated present spectral data thereof.

If rise times and/or fall times within the measurement signals are used as inputs 41, these can be ascertained from the measurement signals by means of the above-described method, that is to say by means of a Padé-Laplace method. The ascertained rise times and/or fall times are likewise supplied to the associated inputs 41 of the neural network 1 for the state estimation 21. In this case, in a manner comparable to the Fourier transform, the peak amplitudes (poles of the Padé-Laplace transforms) are particularly relevant, since these correspond to the characteristic start-up times (rise times) or shut-down times (fall times) of the respective installations. By way of example, heat pumps or the charging of E-cars have such characteristic times that can be ascertained by means of the Laplace transforms and the subsequent determination of the (best) Padéapproximant. In other words, these are preferably likewise used as fingerprints for the learning of the neural network 1 and analogously for the calculation of the state estimation 21. Time series segmentation methods known from machine learning can be used alternatively or additionally to the use of Laplace transforms.

According to the embodiment shown, the captured measurement signals are additionally used as inputs 41 for the neural network 1. In other words, the magnitude of the voltage $U_{n,t,L,F}$, the current $I_{n,t,L,F}$, the active power $P_{n,t,L,F}$ and/or the reactive power $Q_{n,t,L,F}$ is used as an input 41, for example. The index t indicates the respective time dependency of the mentioned variables. In FIG. 1, the mentioned variables or input variables are brought together within the block 44.

Furthermore, exogenous parameters, such as temperatures $T_{n,t}$, geographical coordinates and/or time data ($E_{GHI,n,t}$) and/or weather data and/or historical network states, for example, can be used as inputs when calculating the state estimation. In addition, known temporal voltage profiles of particular installations, such as heat pumps, for example, could furthermore be used directly. Therefore, these mentioned variables must also be provided for training the neural network 1. Further parameters or data can be provided.

The state estimation 21 of the power network can be read from the outputs 21 of the neural network 1. In the present case, the voltages or the magnitudes $|U_{n,t}|$ thereof at the nodes (node voltages) and the branch currents $I_{nn',t}$ between the nodes n and n' are calculated (at the respective time or within the respective time range) by means of the neural network 1 on the basis of the respective inputs/input data 41. The calculated node voltages are combined and identified in the box 22 in FIG. 1. In the present case, the calculated branch currents are combined and identified in the box 24.

Figure 2:
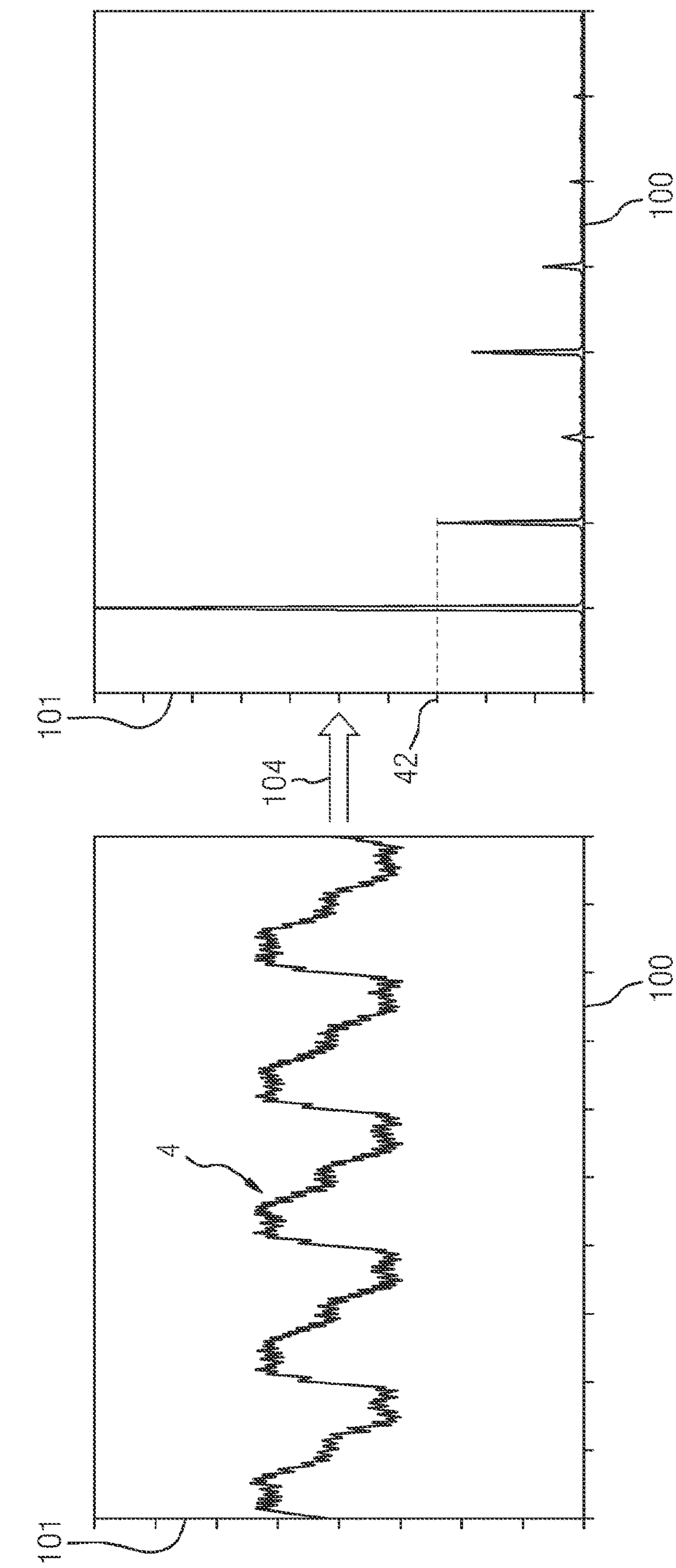
FIG. 2 shows a graph to illustrate the spectral data (harmonics) of a measurement signal incorporating teachings of the present disclosure.

FIG. 2 shows a graph to illustrate the spectral data (harmonics) of a measurement signal 4. The left-hand graph in FIG. 2 shows an exemplary temporal measurement signal 4 of the voltage at a node of the power network. Time is plotted in arbitrary units on the abscissa 100 of the left-hand graph. The magnitude of the voltage is plotted in arbitrary units on the ordinate 101 of the left-hand graph.

The measurement signal 4 has a fundamental frequency of 50 Hz. Furthermore, the measurement signal has higher harmonic components that are not directly discernible on the time characteristic of the measurement signal. If, by way of example, a Fourier transformation 104 of the measurement signal 4 is performed, in particular the amplitude spectrum of the measurement signal 4 can be calculated.

The right-hand graph of FIG. 2 shows the amplitude spectrum ascertained from the measurement signal 4 by means of a Fourier transformation. In addition to noise, said amplitude spectrum has a plurality of spikes that correspond to the harmonics. Each spike characterizes a harmonic, wherein these have different amplitudes. By way of example, in the right-hand graph shown, the harmonics for a fundamental frequency of 50 Hz are 100 Hz, 150 Hz, 200 Hz, 250 Hz, 300 Hz, 350 Hz and 400 Hz. The amplitude of the first harmonic (100 Hz) and the second harmonic (100 Hz) are the greatest in this case.

By means of the amplitude spectrum, the amplitudes of the harmonics can therefore be ascertained for the respective measurement signal and can be used for the state estimation by means of the neural network or for the training thereof. Furthermore, a ratio of amplitudes of the harmonics can preferably be used for the state estimation or the training thereof.

In some embodiments, spectral data, that is to say higher harmonics, are therefore used to train the neural network and therefore for the state estimation by means of the correspondingly trained neural network. Furthermore, characteristic times, which for example can be ascertained by means of a Padé-Laplace transform, are alternatively or additionally used for the training and therefore for the state estimation.

The input variables (amplitude of harmonics, rise times and/or fall times) according to the invention form a fingerprint for the installations connected to the power network, which may improve the estimation of the neural network with respect to the network state. Improved estimation of the network state (state estimation) can be achieved without further or greater installations or investments in the power network. In addition, the methods described herein may save resources, since a Fourier transformation/Laplace transformation is able to be efficiently implemented or is able to be executed directly by the measuring apparatus.

Various embodiments of the teachings herein provide improved state estimation or network state estimation, in particular for highly underdetermined power networks, such as medium-voltage networks or low-voltage networks, for example, is provided. Improved intelligent regulation of the power network, in particular with respect to digital power networks and renewable energies, can thereby be achieved.

Although the teachings have been described and illustrated in more detail by way of the example embodiments, the scope of the disclosure is not restricted by the disclosed examples or other variations may be derived therefrom by a person skilled in the art without departing from the scope of protection.

LIST OF REFERENCE SIGNS

1 Artificial neural network
2 State estimation/outputs
4 Measurement signal
11 Hidden layer
12 Output layer
14 Input layer
21 Outputs/state estimation
22 Voltages
23 Currents
41 Inputs
42 Amplitude/rise times/fall times
43 Further inputs
44 Exogenous inputs
100 Abscissa
101 Ordinate
104 Fourier transformation

What is claimed is:

1. A method for state estimation of a power network using an artificial neural network with one or more inputs technically associated with the power network, the method comprising:

calculating a state estimation using captured temporal measurement signals of the power network calculated at nodes of the power network as inputs for the neural network, the state estimation includes real-time voltages at the nodes and real-time branch currents between the nodes;

wherein at least an amplitude of a harmonic of one of the measurement signals is used as an input for the neural network;

wherein the neural network has been trained using a training dataset comprising a plurality of amplitudes of harmonics of one or more measurement signals or comprising a plurality of rise times and/or fall times of one or more measurement signals.

2. The method as claimed in claim 1, further comprising ascertaining the amplitude of the harmonic using a Fourier transformation of the measurement signal.

3. The method as claimed in claim 1, further comprising using one or more ratios of amplitudes of harmonics of the measurement signal as inputs.

4. The method as claimed in claim 1, further comprising using one or more rise times and/or one or more fall times within the measurement signal as inputs.

5. The method as claimed in claim 4, further comprising ascertaining the rise times and/or fall times using a Padé-Laplace method;

wherein the rise times and/or fall times are ascertained using the poles of the Padé approximation of the Laplace transforms of the measurement signal.

6. The method as claimed in claim 5, further comprising using an order [n/(n−1)] for the Padé approximation.

7. The method as claimed in claim 6, further comprising increasing n up to a stipulated maximum value until no further rise times and/or fall times are ascertained.

8. The method as claimed in claim 1, further comprising using amplitudes of subharmonics of the measurement signal as inputs.

9. The method as claimed in claim 1, wherein the measurement signals comprise one or more voltage signals, one or more current signals, one or more active power signals, or one or more reactive power signals of the power network.

10. The method as claimed in claim 1, further comprising capturing the measurement signals at nodes of the power network.

11. The method as claimed in claim 1, wherein the power network comprises a low-voltage network and/or a medium-voltage network.

12. A method for training an artificial neural network for the state estimation of a power network with one or more inputs technically associated with the power network, wherein the state estimation is calculated using captured temporal measurement signals of the power network calculated at nodes of the power network, the state estimation includes real-time voltages at the nodes and real-time branch currents between the nodes, the method comprising:

training the network using a training dataset with a plurality of amplitudes of harmonics, a plurality of rise times, and/or a plurality of fall times of one or more measurement signals; and using the amplitudes of the harmonics, the rise times, and/or the fall times as input to train the neural network.

* * * * *